United States Patent
Kawai

(10) Patent No.: US 6,504,458 B2
(45) Date of Patent: Jan. 7, 2003

(54) TUNING CIRCUIT WITH CONTROLLED NEGATIVE RESISTANCE

(75) Inventor: Kazuo Kawai, Tokyo (JP)

(73) Assignee: General Research of Electronics, Inc., Tokyo (JP)

(*) Notice: Subject to any disclaimer, the term of this patent is extended or adjusted under 35 U.S.C. 154(b) by 0 days.

(21) Appl. No.: 09/932,570

(22) Filed: Aug. 16, 2001

(65) Prior Publication Data

US 2002/0118082 A1 Aug. 29, 2002

(30) Foreign Application Priority Data

Dec. 28, 2000 (JP) .................................. 2000-400944

(51) Int. Cl.[7] .......................... H03H 11/52; H03H 11/00
(52) U.S. Cl. ...................................... 333/213; 333/217
(58) Field of Search ................................ 331/105, 107, 331/108, 115, 116, 96; 327/552, 557, 559; 333/175, 213, 216, 217; 379/206.01, 340, 398

(56) References Cited

U.S. PATENT DOCUMENTS

| | | | | |
|---|---|---|---|---|
| 3,636,266 A | * | 1/1972 | Martin | 379/206.01 |
| 3,723,773 A | * | 3/1973 | Adams et al. | 327/552 |
| 3,829,625 A | * | 8/1974 | Martin | 379/340 |
| 4,122,414 A | * | 10/1978 | Patterson | 331/116 R |
| 4,338,582 A | * | 7/1982 | Presser | 333/175 |
| 5,451,915 A | * | 9/1995 | Katzin et al. | 333/213 |
| 6,239,664 B1 | * | 5/2001 | Northam | 331/108 R |

* cited by examiner

*Primary Examiner*—Patrick Wamsley
(74) *Attorney, Agent, or Firm*—Flynn, Thiel, Boutell & Tanis, P.C.

(57) ABSTRACT

In order to automatically set a Q value to an optimal value, a tuning circuit has a resonance circuit composed of an inductor and a capacitor. The resonance circuit includes a negative resistance circuit having a dummy load resistance and a negative impedance converter. An operating circuit provides the dummy load resistance so that a negative resistance value is output to obtain a desired Q value.

10 Claims, 2 Drawing Sheets

TUNING CIRCUIT WITH CONTROLLED NEGATIVE RESISTANCE

BACKGROUND OF THE INVENTION

1. Field of the Invention

The present invention relates to design techniques of circuit for increasing Q ratio by adding a negative resistor to a tuning circuit using an inductor and a capacitor.

2. Description of the Related Art

In order to improve a frequency selectivity of receiver, it may substantially have a large Q ratio of a tuning circuit of the receiver. However, it is adopted that a high frequency amplifier and a tuning circuit are added to the receiver, for it is difficult to improve the receiver so as to realize a marked difference improvement more than present receiver by means of material design or physical structure of inductor mainly. However, such method has a difficult troublesome that pertain two or more tuning frequency must be accurate interlocked.

As an another method, there is a method to increase Q value of the tuning circuit directly using a negative resistance circuit. The method had been many used as a regenerative detection system until a heterodyne system is developed. However, it is necessary to set up a positive feedback circuit manually in every time a tuning frequency is changed.

SUMMARY OF THE INVENTION

The object of the present invention is to realize a Q value of a tuning circuit capable of setting up a fixed value automatically when the Q value of the tuning circuit is increased using a negative resistance circuit without above-mentioned drawbacks in that the turning circuit is set up manually.

In order to achieve the above object, one aspect of the tuning circuit according to the present invention, a subject matter of the invention has an inductance and a capacitor and a negative resistance circuit connected to the resonance circuit in series, comprising:

a setting means for calculating a serial resistance value having said resonance circuit and setting up a negative resistance value of said negative resistance circuit using said serial resistance value and a resistance value for obtaining a necessity Q value to an optimum resistance value.

In the present invention, the setting means may be constituted to make an effective serial resistance of said tuning circuit be in weak oscillation state by controlling a negative resistance of said negative resistance circuit and to do operations;

for detecting an oscillation amplitude value at changing a negative resistance value;

for calculating said serial resistance value;

for subtracting from resistance value for obtaining said necessity Q value to the serial resistance value; and for setting up said optimal resistance value.

In the present invention, it is preferred that the tuning circuit may comprise means for separating said setting means from an input/output of said tuning circuit.

DESCRIPTION OF THE PREFERRED EMBODIMENT

In a tuning circuit composed of a resonance circuit comprised of an inductor and a capacitor and a negative resistance circuit, it is possible to obtain a serial resistance value of the resonance circuit by detecting an oscillation amplitude value when the tuning circuit is in oscillating state by controlling a negative resistor of the negative resistance circuit in order to make an effective serial value of the tuning circuit be negative value when a frequency of the tuning circuit is changed. Thereby, a method according to the present invention may calculate a negative resistance value of a necessity negative resistance circuit in order to obtain a necessity Q value by obtaining the serial resistance value. However, since the method interrupts a receiving function momentary by working, it is preferred that the tuning circuit may be separated from a subsequent stage of the receiver and antenna by means of an influence which oscillation signal influences the subsequent stage of the receiver having a tuning circuit.

Prior to an embodiment according to the present invention, a detecting method of before-mentioned serial resistance will be explained in below.

Negative resistance circuits are many kinds of types. However, the circuit contains almost a positive feed back circuit. When an effective serial resistance component (a serial synthesized value of a serial resistance component according to an oscillating frequency of an oscillating circuit composed of an inductor and a capacitor, and a negative resistance of a negative resistance circuit) becomes negative, an oscillation is started. Since an amplitude of an oscillating signal is almost proportional to an effective negative serial resistance value, by using this relation a serial resistance value can be detected.

This point will be described with reference to the accompanying FIG. 1 as follows. Set a serial resistance component of the resonance circuit to $r_s$, when a negative resistance value of the negative resistance circuit is set $r_{n1}$, an effective serial resistance value of the tuning circuit $r_1$ is $r_1 = r_s + r_{n1}$. When a negative resistance value of the negative resistance circuit is set to $r_{n2}$, an effective serial resistance value $r_2$ is $r_2 = r_s + r_{n2}$. Set an oscillating amplitude $e_1$ at an effective serial resistance value $r_2$ and an oscillating amplitude $e_2$ at an effective serial resistance value $r_2$, relationship between an effective serial resistance value $r$ and an oscillating signal amplitude $e$ becomes as shown in FIG. 1.

Figure 1:
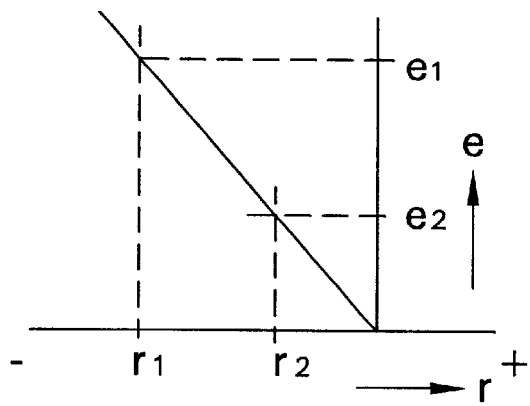
FIG. 1 is a graph relating to between an effective negative serial resistance and an oscillating level of a serial tuning circuit of a negative resistance circuit comprised of inductors and capacitors.

From relationship between a negative resistance value and an oscillating signal amplitude shown in FIG. 1, an equation (1) is obtained.

$$e_2 - \frac{e_1 - e_2}{r_{n1} - r_{n2}}(r_s + r_{n2}) = 0 \tag{1}$$

The equation (1) is modified about $r_s$ then equation (2) is obtained as below.

$$rs = \frac{r_{n1} - r_{n2}}{\frac{e_1}{e_2} - 1} - r_{n2} \quad (2)$$

The above equation is organized by all the known values which are known negative resistance values set up for detecting and thereby detected value of an oscillation signal amplitude. Therefore, by operating the equation, an original serial resistance component $r_s$ of the circuit can be calculated.

If the value $r_s$ is obtained, and a serial resistance component for obtaining a necessity Q value is $r_d$, a negative resistance value $R_N$ to be set up in a negative resistance circuit $R_N$ may satisfy $r_n + R_N = r_d$, so $R_N$ is obtained by relation $R_N = r_d - r_s$. Thus $R_N$ is obtained from said relation and equation (2), that is, equation (3).

$$R_N = r_d + r_{n2} - \frac{r_{n1} - r_{n2}}{\frac{e_1}{e_2} - 1} \quad (3)$$

The negative resistance circuit is formed using a negative impedance converter and a dummy load resistance. However, if a converting coefficient is −1, then a dummy load resistance $R_N$ of the negative impedance converter may multiply −1 of a right member of an equation (3). Therefore, in conclusion equation (4) may be operated.

$$R_N = -r_d - r_{n2} + \frac{r_{n1} - r_{n2}}{\frac{e_1}{e_2} - 1} \quad (4)$$

Figure 2:
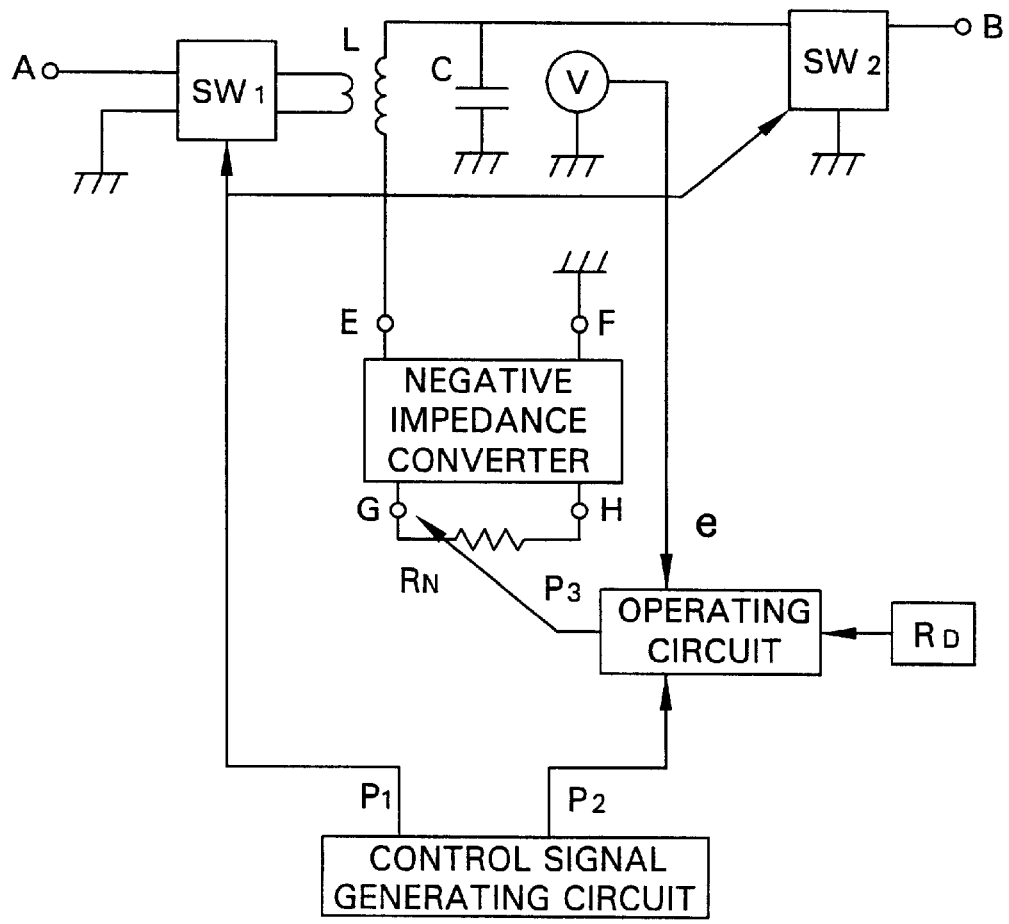
FIG. 2 is a circuitry structural drawing to explain an embodiment of the present invention.

The tuning circuit of the present invention is constituted so that detection and operation according to the above-described equation (4) is done and an embodiment thereof is shown in FIG. 2.

In FIG. 2, A is a RF signal input terminal from a preceding stage or antenna, B is a signal output terminal, L is an inductor, C is a variable capacitor, $SW_1$ and $SW_2$ are switches, NIC is a negative impedance converter, E, F, G and H are four input/output terminals, $R_N$ is a dummy-load resistor, V is a signal amplitude detector, CAL is an operating circuit, CONT is a controlling signal generating circuit, $P_1$ and $P_2$ are control signal lines of outputs of the device and $R_D$ is a setting section of a serial resistance for gaining a necessity Q value.

First, a variable capacitor C is set up a predetermined value determining a tuning frequency for selecting a channel. In this part, subsequently an operating action will be explained in below. Second, the tuning circuit is separated from input and output terminals A, B by switches $SW_1$ and $SW_2$. A dummy load resistance $R_N$ of the negative impedance converter NIC is set up by a signal of the control signal line $P_2$. If a converting coefficient of the negative impedance converter is −1 in this embodiment, when dummy load resistance $r_{n1}$ is connected between terminal G and H, input impedance obtained between terminal E and F is $-r_{n1}$. If the value is a negative resistance by using a prescribed composites resistance $r_1 = r_s + r_{n1}$, the tuning circuit oscillates. Thereby, the oscillation signal amplitude $e_1$ is detected by the signal amplitude detector V and obtained voltage is added to the operating circuit CAL. A dummy load resistance of a negative impedance converter NIC is set up to $r_{n2}$ by a control signal from a control signal generating circuit CONT, and the negative resistance $r_2$ is $r_2$ $r_3 + r_{n2}$, then at this time the oscillating signal amplitude $e_2$ is detected and added to the operating circuit CAL.

In the operating circuit CAL, by using a set up value $r_{n1}$ and $r_{n2}$ and detected $e_1$ and $e_2$ and calculation of equation (4) to obtain a necessity Q is done and $R_N$ is calculated. Thereby, the dummy load resistance of the negative resistance converter is set up to the calculated $R_n$. A setting method of this resistance may use for example a diode as a dummy load resistance and control a forward current therethrough with an output of an operating circuit.

Figure 3:
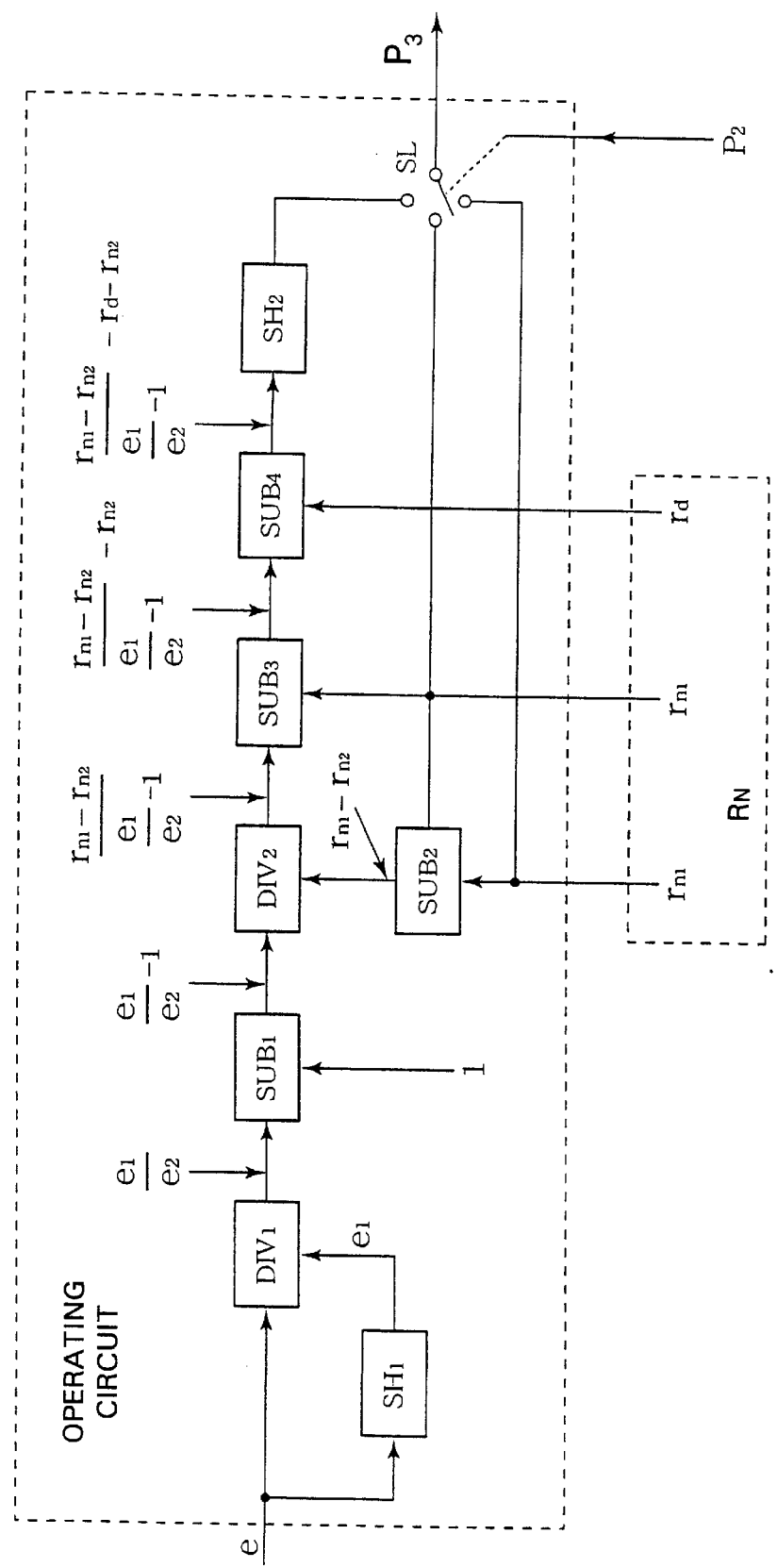
FIG. 3 is a circuitry structural drawing to explain an example of inner construction of an operating circuit which is most important of the circuitry structural drawing according to FIG. 2.

The operating circuit CAL may adopt many kinds of circuits as shown in FIG. 3. In FIG. 3, $SH_1$ and $SH_2$ are sample and hold circuits, $DIV_1$ and $DIV_2$ are division circuits, $SUB_1$ to $SUB_4$ are subtracters, SL is a selector. The sample and hold circuit $SH_1$ holds preceding detected value $e_1$ while it operates and the sample and hold circuit $SH_2$ holds an operated output value. Operation of each of circuits can be understood by each of equations shown in FIG. 3.

An explain of operating system of the present invention is done by operation due to analogue circuits, but the present invention may be used digital circuits. Adopting the digital circuit may used preferably because constitution of circuit is much miniaturized and simplified. Especially, a sample and hold circuit $SH_2$ may stabilize in holding characteristics rather than analogue.

As described so far, by using the present invention, when the tuning frequency is changed, Q value can be set up automatically in optimum, thereby, a receiver can be received with a high Q value in stability at all times.

What is claimed is:

1. A tuning circuit having a resonance circuit comprising an inductor and a capacitor, and having a negative resistance circuit connected to the resonance circuit in series, comprising:

a setting apparatus for calculating a serial resistance value $r_s$ of said resonance circuit and setting up a negative resistance value $r_n$ of said negative resistance circuit using said serial resistance value $r_s$ and a resistance value $r_d$ for obtaining a necessary Q value at an optimum resistance value $R_N$, wherein said setting apparatus includes:

a controller to provide effective serial resistance values equal to $r_s + r_n$ for said tuning circuit to be in a weak oscillation state by controlling the negative resistance value $r_n$, a detector device for detecting oscillation amplitude values $e_1$, $e_2$ at changing said effective serial resistance values $r_1$, $r_2$, and, a calculator device for calculating said serial resistance value $r_s$ by using said negative resistance values and said oscillation amplitude values and subtracting said serial resistance value $r_s$ from a resistance value $R_d$ to obtain the necessary Q value.

2. A tuning circuit for receiving an RF input signal and providing an RF output signal comprising:

an inductor for receiving the RF signal, the inductor having two terminals, a first terminal being connected to the RF output signal terminal;

a capacitor connected across the first terminal of said inductor and ground;

a signal amplitude detector connected across the first terminal of said inductor and ground, said detector outputting an oscillation amplitude signal;

a control signal generating device for outputting a control signal;

a setting section for outputting a serial resistance value $r_d$ for gaining a desired Q value for the tuning circuit;

a negative impedance converter having an output connected to the second terminal of said inductor; and an operating circuit for receiving the serial resistance value $r_d$ from the setting section, the control signal from the control signal generating device and an oscillation amplitude signal from the signal amplitude detector, wherein said operating circuit in response to the control signal calculates a negative load resistance value $R_N$ and provides the negative load resistance value to said negative impedance converter.

3. The tuning circuit for receiving an RF input signal and providing an RF output signal of claim 2, further comprising a first switch connected to an input terminal providing the RF input signal and a second switch connected to the first terminal of said inductor and to an RF output terminal.

4. The tuning circuit for receiving an RF input signal and providing an RF output signal of claim 3, wherein the first switch and the second switch are controlled by a switch control output signal from said control signal generating device.

5. The tuning circuit for receiving an RF input signal and providing an RF output signal of claim 2, wherein the operating circuit calculates a serial resistance component value for the resonance circuit from the oscillation amplitude signal from the signal amplitude detector.

6. The tuning circuit for receiving an RF input signal and providing an RF output signal of claim 5, wherein the negative load resistance value $R_N$ equals $r_d-r_s$.

7. The tuning circuit for receiving an RF input signal and providing an RF output signal of claim 2, wherein said capacitor comprises a variable capacitor set at a predetermined value for a tuning frequency corresponding to a selected channel.

8. A tuning circuit comprising a resonance circuit including an inductor, capacitor and a negative resistance circuit, said negative resistance circuit comprising:

a signal amplitude detector connected to said inductor and outputting oscillation amplitude signals $e_1$, $e_2$;

a setting section for outputting a serial resistance value $r_d$ for gaining a desired Q value for the resonance circuit;

a negative impedance converter having an output connected to the inductor; and an operating circuit for providing a negative resistance value $R_N$ to the negative impedance converter, wherein the resonance circuit has a serial resistance component value $r_s$, a negative resistance value $r_{n1}$ for the negative resistance circuit at the oscillation amplitude signal $e_1$, an effective serial resistance value $r_1$ for the resonance circuit equal to $r_s+r_{n1}$, a negative resistance value $r_{n2}$ for the negative resistance circuit at the oscillation amplitude signal $e_2$, and an effective serial resistance value $r_2$ for the resonance circuit equal to $r_s+r_{n2}$.

9. The tuning circuit of claim 8, wherein an equation defining the serial resistance component $r_s$ is as follows:

$$R_N = -r_d - r_{n2} + \frac{r_{n1} - r_{n2}}{\dfrac{e_1}{e_2} - 1}$$

10. The tuning circuit of claim 8, wherein the negative resistance value $R_n$ equals $r_d-r_s$.

* * * * *